(12) United States Patent
Kappagantula et al.

(10) Patent No.: US 11,854,715 B2
(45) Date of Patent: Dec. 26, 2023

(54) ULTRACONDUCTIVE METAL COMPOSITE FORMS AND THE SYNTHESIS THEREOF

(71) Applicant: Ohio University, Athens, OH (US)

(72) Inventors: Keerti S. Kappagantula, Athens, OH (US); Frank Frederick Kraft, Albany, OH (US)

(73) Assignee: Ohio University, Athens, OH (US)

( * ) Notice: Subject to any disclaimer, the term of this patent is extended or adjusted under 35 U.S.C. 154(b) by 335 days.

(21) Appl. No.: 16/336,949

(22) PCT Filed: Sep. 27, 2017

(86) PCT No.: PCT/US2017/053664
§ 371 (c)(1),
(2) Date: Mar. 27, 2019

(87) PCT Pub. No.: WO2018/064137
PCT Pub. Date: Apr. 5, 2018

(65) Prior Publication Data
US 2019/0267153 A1  Aug. 29, 2019

Related U.S. Application Data

(60) Provisional application No. 62/406,587, filed on Oct. 11, 2016, provisional application No. 62/400,260, filed on Sep. 27, 2016.

(51) Int. Cl.
*B21C 33/00* (2006.01)
*H01B 1/02* (2006.01)
(Continued)

(52) U.S. Cl.
CPC .............. *H01B 1/04* (2013.01); *B21C 3/04* (2013.01); *B21C 33/004* (2013.01); *H01B 1/02* (2013.01);
(Continued)

(58) Field of Classification Search
CPC . H01B 1/04; H01B 1/02; H01B 1/023; H01B 1/026; B21C 37/04; B21C 33/004;
(Continued)

(56) References Cited

U.S. PATENT DOCUMENTS 4,529,458 A * 7/1985 Kushnick .................. B22F 3/24
148/304
6,258,457 B1 * 7/2001 Ottinger ................. F16J 15/122
428/408
(Continued)

FOREIGN PATENT DOCUMENTS

CN 101650981 A 2/2010
CN 104540778 A 4/2015
(Continued)

OTHER PUBLICATIONS

Liu et al., "Fabrication of high-strength graphene nanosheets/Cu composites by accumulative roll bonding," Materials Science & Engineering A 642 (2015), pp. 1-6 (Year: 2015).*
(Continued)

*Primary Examiner* — John A Hevey
(74) *Attorney, Agent, or Firm* — Wood Herron & Evans LLP

(57) ABSTRACT

A method of forming a metal-graphene composite includes coating metal components (10) with graphene (14) to form graphene-coated metal components, combining a plurality of the graphene-coated metal components to form a precursor workpiece (26), and working the precursor workpiece (26) into a bulk form (30) to form the metal-graphene composite. A metal-graphene composite includes graphene (14) in a metal matrix wherein the graphene (14) is single-atomic layer or multi-layer graphene (14) distributed throughout the metal matrix and primarily (but not exclu-
(Continued)

sively) oriented with a plane horizontal to an axial direction of the metal-graphene composite.

12 Claims, 2 Drawing Sheets

(51) Int. Cl.
| | |
|---|---|
| B21C 37/04 | (2006.01) |
| B21C 23/00 | (2006.01) |
| C23C 16/26 | (2006.01) |
| B82Y 30/00 | (2011.01) |
| H01B 1/04 | (2006.01) |
| B21C 3/04 | (2006.01) |

(52) U.S. Cl.
CPC .............. *H01B 1/023* (2013.01); *H01B 1/026* (2013.01); *B21C 23/002* (2013.01); *B82Y 30/00* (2013.01); *C23C 16/26* (2013.01)

(58) Field of Classification Search
CPC ....... B21C 23/002; B82Y 30/00; C23C 16/26; C22F 1/08
See application file for complete search history.

(56) References Cited

U.S. PATENT DOCUMENTS

| | | | |
|---|---|---|---|
| 7,651,766 B2 | 1/2010 | Chen | |
| 7,784,531 B1 | 8/2010 | Li et al. | |
| 2012/0267141 A1 | 10/2012 | Kamiyama et al. | |
| 2013/0248229 A1 | 9/2013 | Martens | |
| 2015/0041326 A1 | 2/2015 | Buckner et al. | |
| 2015/0368535 A1* | 12/2015 | Dardona | H01B 1/026 428/368 |
| 2016/0168693 A1* | 6/2016 | Schmidt | H01B 7/0018 427/117 |
| 2021/0197241 A1* | 7/2021 | Grant | B21C 23/002 |

FOREIGN PATENT DOCUMENTS

| | | |
|---|---|---|
| CN | 105917419 A | 8/2016 |
| WO | 2015013349 A1 | 1/2015 |

OTHER PUBLICATIONS

Chinese Office Action in Chinese Patent Application No. 201780071589.6 (English translation), dated Mar. 3, 2020, 11 pgs.
Bartolucci, S. F. et al., "Graphene-aluminum nanocomposites," Materials Science and Engineering A (2011) 528:7933-7937.
Kumar, H. G. P. et al., "12th Global Contress on Manufacturing and Management, GCMM 2014—Graphene Reinforced Metal Matrix Composite (GRMMC): A Review," ScienceDirect, Procedia Engineering (2014) 97:1033-1040.
Moghadam, A. D. et al.,"Mechanical and tribological properties of self-lubricating metal matrix nanocomposites reinforced by carbon nonotubes (CNTs) and graphene—A review," Accepted Manuscript, Composites Part B, Mar. 2015, 40 pages.
Subramanian, C. et al., "One hundred fold increase in current carrying capacity in a carbon nonotube-copper composite," Nature Communications (2013) pp. 1-7.
O. Hjorstam, P. Isberg, S. Soderholm, H. Dai, Copper carbon nanotube composites, 2004, Applied Physics A, vol. 78.
P. Rohatgi, B. Schultz. Lightweight Metal Matrix Nanocomposites—Stretching boundaries of metals. Material Matters: Advanced Metals and Alloys. 2007, vol. 2, 4, pp. 16-20.
Ill, Henry C. de Groh. Consideration of Conductive Motor Winding Materials at. Cleveland, Ohio : National Aeronautics and Space Administration Glenn Research Center, 2015.
International Search Authority, International Search Report and Written Opinion issued in corresponding PCT Application No. PCT/US17/53664, dated Dec. 7, 2017 (12 pages).
Database WPI Week 201661 Thomson Scientific, London, GB; AN 2016-50827N XP002797746, -& CN 105 845 942 A (Univ Shandong Jianzhu) Aug. 10, 2016 (Aug. 10, 2016) abstract.
European Supplementary Search Report in European Patent Application No. 17857315.0, dated Feb. 28, 2020, 6 pgs.

\* cited by examiner

ULTRACONDUCTIVE METAL COMPOSITE FORMS AND THE SYNTHESIS THEREOF

TECHNICAL FIELD

The present invention relates generally to ultra-conductive metal and methods of making same and, more specifically, to metal-graphene composite forms.

BACKGROUND

Commercially pure copper is the most widely used bulk electrical conductor in virtually all industrial and commercial sectors. It is overwhelmingly used for AC motors, generators, alternators, electronics, electrical transmission (i.e., wiring and bus bars), and more. Copper's unique combination of attributes, including high conductivity (second only to silver), high ampacity (electrical density, defined as current passing through a unit cross-sectional area), good strength, ductility, and oxidation/corrosion properties, at low cost make it ideal for most electrical applications. Copper is refined to a requisite amount of elemental purity to achieve the greatest practical electrical conductivity, from a performance-cost view point. As such, impurity elements, oxides, alloying or trace elements, and porosity all decrease the electrical properties of copper and metals in general.

The electrical conductivity of metals is typically related to that of copper via the International Annealed Copper Standard (IACS). The standard establishes 100% IACS as a conductivity of 58.001 Mega Siemens per meter (MS/m) at 20° C. Current (purer) grades of commercial copper wire achieve up to about 101% IACS. In contrast, silver has 107% IACS meaning an electrical conductivity of 62.1 MS/m.

Presently, ultra-conductive copper (UCC) is a highly sought after technology in the copper industry due to its readily evident material properties. UCC is defined as a copper (Cu) based material system, such as a composite or alloy, comprised predominantly of copper, with additives distributed in the copper matrix, such that the composite material exhibits electrical conductivity greater than 58.001 MS/m or 100% IACS.

Currently, UCC is envisioned to be synthesized as having copper with nanoscale carbon additives, in particular carbon nanotubes (CNTs) and graphene nano-particles (GNPs), such that the resultant material has ultrahigh electrical conductivity and thermal conductivity. Methods of synthesizing Cu/CNT or Cu/GNP have been attempted and include, for example, deformation processing, vapor phase processing, solidification processing, electrodeposition, electrophoretic deposition, and composite assembly through powder metallurgy. However, the material synthesized and referred to as UCC thus far in literature have not demonstrated at least 100% IACS, and have not been successfully made in a manner suitable for bulk scale commercial production. Per IACS, bulk scale UCC is defined to possess two specific features: (a) the dimensions of the forms synthesized have to be greater than 1.3 mm; and (b) the length of the specimen over which electrical resistivity or electrical conductivity is measured must be at least 1 m. The primary problems associated with contemporary UCC synthesis (failed) efforts include high energy expenditure during material processing, long processing time, process design and conditions that cause defects or introduce impurities in the additives, relatively high costs, and inability of processing methods for integration with existing copper form manufacturing units.

Considering these facts, there is a need for improved methods for synthesizing UCC and other ultra-conductive metals that address one or more of the drawbacks discussed above.

SUMMARY

In an aspect of the present invention, a method of synthesizing a metal-graphene composite is provided and includes coating or otherwise introducing metal components with graphene, forming a precursor workpiece from the graphene-coated/inhibited metal components, and forming a bulk form of the metal-graphene composite from the precursor workpiece.

In an aspect of the present invention, a metal-graphene composite is provided and includes graphene in a metal matrix wherein the graphene is single-layer or multi-layer graphene sheets with nano-scale thickness, distributed throughout the metal matrix and primarily (but not exclusively) oriented with a plane horizontal to an axial direction of the metal-graphene composite.

The objects and advantages of present will be appreciated in light of the following detailed descriptions and drawings in which:

DETAILED DESCRIPTION

Embodiments of the present invention are directed to ultra-conductive metal-graphene composite forms. For example, a metal component (e.g., a wire, rod, bar, sheet, strip, film, or foil) may be coated with graphene and formed into a bulk form (e.g., a wire, rod, bar, sheet, strip, or foil). Further embodiments are directed to methods of synthesizing ultra-conductive metal-graphene composite forms. As used herein, a "metal-graphene composite" refers to both composites and nano-alloys of the metal and graphene. In various embodiments, the metal may be, without limitation, copper, aluminum, silver, gold, titanium, nickel, iron, magnesium, manganese, cobalt, zinc, and chromium. Thus, while the embodiments described below relate to ultra-conductive copper-graphene composites, the invention is not so limited.

In an aspect of the present invention, a metal-graphene composite may have enhanced electrical properties compared to a conventional metal component with commercial grade purity. Conventional material behavior demonstrates that electrical conductivity increases with metal purity and consequently decreases with alloy additions, second phase additives, and impurities. Such impurity elements manifest as solid solutions and/or second phases in the matrix metal during processing, all of which decrease electrical properties (i.e., electrical conductivity and ampacity) of the bulk metal. However, in graphene, three of the four outer shell electrons are used to covalently bond within the hexagonal graphene plane. The other electron is a pi (π) electron, which is highly mobile and is localized over the surface. The high inherent electrical properties of graphene may be attributed to the presence of this localized pi electron shell, which is somewhat analogous to the 4 $s^1$ electron in copper. These electrons may work in tandem in a metal-graphene composite, to produce enhanced electrical properties. Thus, an embodiment of the present invention includes a metal-graphene composite in bulk form, in which single- or multi-layer graphene is distributed in the metal matrix and primarily oriented with the plane horizontal to the axial direction (but not exclusively), which produces ultra-conductivity and ultra-ampacity (i.e., conductivity above 100% IACS and greater ampacity than commercial grades).

Figure 1A:
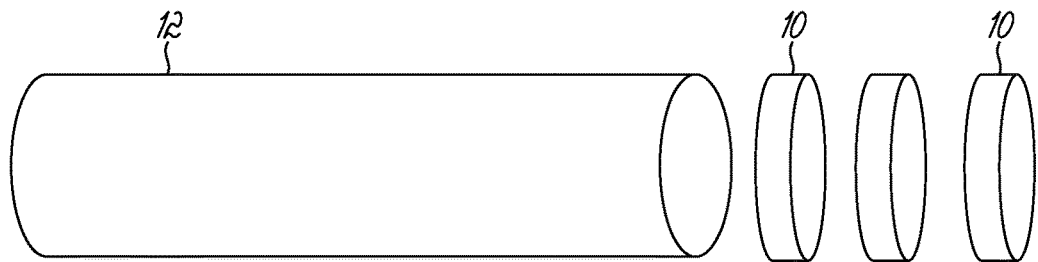
FIG. 1A is a schematic of a copper rod being cut into copper profiles in the shape of discs in accordance with an embodiment of the present invention.

With reference to FIGS. 1A-1D, in an embodiment, a method of synthesizing an ultra-conductive copper-graphene composite form includes forming copper profiles and coating the copper profiles with graphene. As an example, FIG. 1A, shows a copper rod 12 may be cut into copper discs 10 having a circular cross section. While the copper bulk form is shown in the form of a rod, it may have other forms such as sheet copper, copper foil, copper particles with micron or nanoscale diameters, and other bulk copper products. Similarly, while the copper profiles are shown in the form of discs, the profiles can have other cross-sectional shapes including, without limitation, a rectangular cross-section, a square cross-section, a triangular cross-section, a hexagonal cross-section, etc. Further, forms of the copper profiles include, without limitation, copper pellets, shot, powder, strips, sheets, foils, films, wires, rods, bars, or particles. In an embodiment, the copper rod 12 may be 00.625 inch in diameter and made of 4N purity (or typical UNS 10100 copper), and the copper discs 10 may have a thickness of approximately 0.125 in, 50 μm, 18 μm or less than 10 μm. The thickness of the copper profiles may be as small as 240 picometers (pm) (i.e., the covalent diameter of copper atoms) and as large as required, depending on the size of the desired precursor billet. The cross-sectional dimension (e.g., the diameter of a profile having a circular cross-section) of the profiles can be as small as 240 μm and as large as desired, depending on the size of the billet desired as well as the scale of the manufacturing operation. Other copper forms of various sizes can also be used in the production of the precursor composite copper billet. As previously described, the copper profiles may be made of another metal, such as aluminum, etc.

Figure 1B:
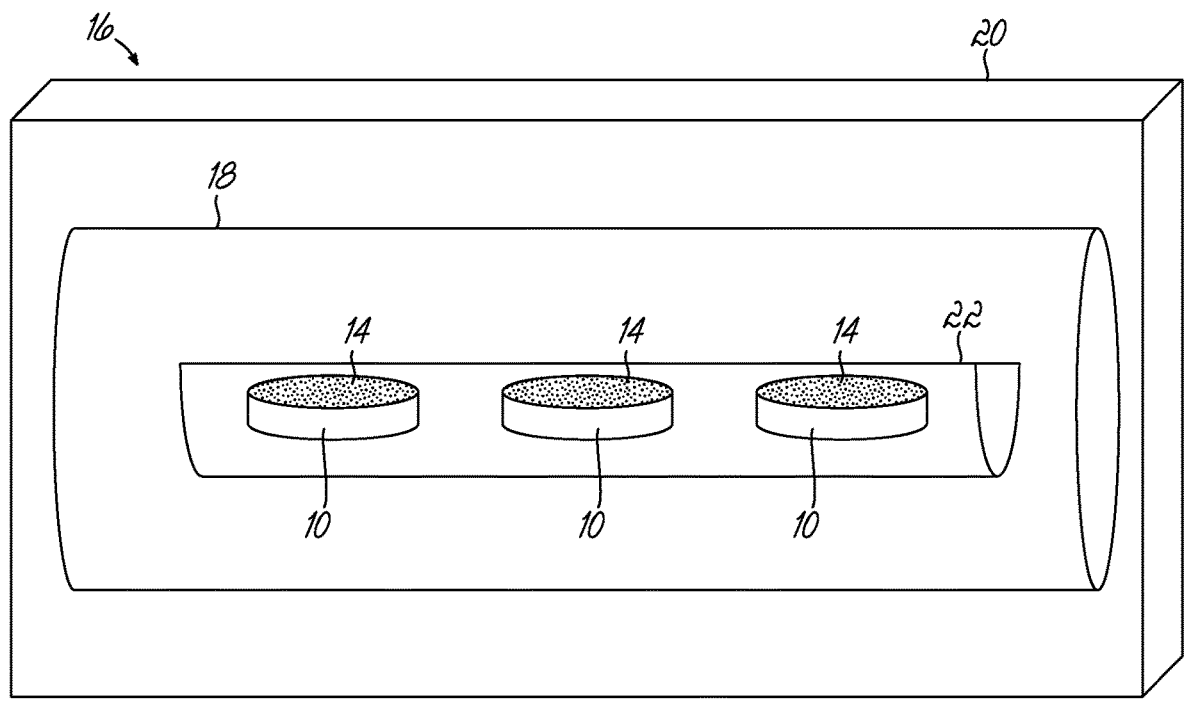
FIG. 1B is a schematic of a CVD device for depositing graphene onto the copper discs of FIG. 1A in accordance with an embodiment of the present invention.

Next, the copper profiles may be coated with graphene. As shown in FIG. 1B, in an embodiment, the copper discs 10 may be coated with graphene 14 via chemical vapor deposition (CVD) method. In an embodiment, the CVD method may utilize a high temperature CVD apparatus 16 to deposit the graphene 14 directly onto the surface of the copper discs 10. In general, the CVD apparatus includes a large chamber with heating elements 18, and it is fitted with a vacuum pump (not shown) and several valves to feed the graphene precursor (e.g., coal, coke, petroleum coke, graphite, methane or various hydrocarbons) along with carrier gases (e.g., hydrogen, methane, carbon monoxide, noble gases, etc.) to the furnace. The copper discs 10 to be coated with graphene are placed on holders 22 inside the CVD chamber 18. The operating conditions of the chamber 18 are maintained at prescribed temperature and pressure ranges, which are dependent on the precursor and carrier gases used, as well as the chamber material and copper profile dimensions. When graphene precursors and carrier gases are passed at the optimal CVD chamber operating conditions, single or multiple layers of graphene sheets in the form of hexagonally arranged $sp^2$ bonded carbon atoms are formed on the copper profiles. The number of graphene layers may range from, for example, 1 layer to 20 layers. The resulting graphene coating 14 may have a minimum thickness of 120 μm (covalent diameter of carbon atoms).

Figure 1C:
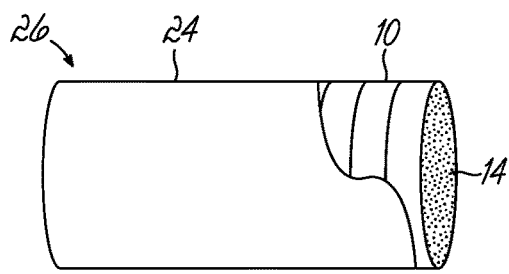
FIG. 1C is a partial view of a billet, which is a stack of the graphene-coated copper discs wrapped a copper foil in accordance with an embodiment of the present invention.
Figure 1D:
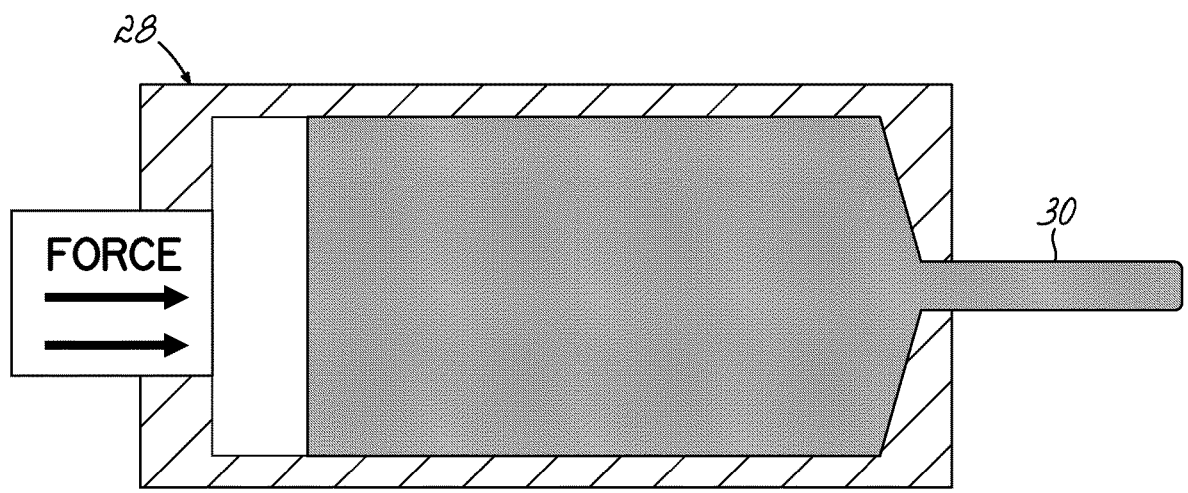
FIG. 1D is a schematic of a hot extrusion process to form a monolithic copper-graphene composite wire from the billet in accordance with an embodiment of the present invention.

Next, the graphene coated copper profiles may be arranged to form a precursor workpiece, which may have various forms such as a billet, rod, plate, or sheet. As shown in FIG. 1C, the graphene-coated copper discs 10 are arranged in a preferred format. In the illustrated embodiment, the graphene-coated copper discs 10 are wrapped in copper foil 24 to assemble a billet 26 of desired dimensions. Although each of the copper discs 10 that form the billet 26 are shown having a graphene coating, it is not necessary for all the copper profiles used to make the billet to have a graphene coating on them. Further, a billet may be composed of copper profiles with different forms, sizes, and cross-sectional shapes, with or without graphene coating on the surface. For example, the billet can also be comprised of CVD coated copper pellets, shots, powder, sheets, foils, wires, rods, or any combination of coated and uncoated forms to produce the composite copper billet (i.e., the yet un-formed or un-extruded precursor workpiece). Referring to FIG. 1D, a hot extrusion device 28 may be used to hot-press and extrude the billet 26 to form a bulk form of the composite. Hot-pressing may occur at temperatures up to 900° C. and may include applying pressures up to 50 kpsi to the precursor workpiece. The bulk form may also be formed from the precursor workpiece using other mechanical processes such as cold-pressing at ambient temperature, rolling, or drawing. Cold-pressing may occur at ambient temperature and may include applying pressures up to 75 kpsi to the precursor workpiece. The extrusion or other forming of the precursor workpiece into the bulk form may be conducted in an inert environment (e.g., in a nitrogen atmosphere). For example, the billet 26 may be formed into a wire 30 (or other profile shape) made of ultra-conductive copper that has a diameter of about 0.0808 in (12 AWG wire) and has a length of about 12 inches. Note that wires of much longer or smaller lengths, and larger or smaller diameters can be produced in a manufacturing scenario with larger billets. The extruded bulk forms can have virtually any dimension and shape depending on the dies used during extrusion. Other extruded profiles can differ in size and shape, including rods, bars, plates, strands, tubes, and strips, for example. During the fabrication and extrusion of the billet 26, the graphene 14 becomes distributed in the copper matrix and is primarily (but not exclusively) oriented with a graphene plane being horizontal to an axial direction of the extruded form 30. As described above, metal-graphene composites other than a copper-graphene composite may be formed using this method.

Figure 2:
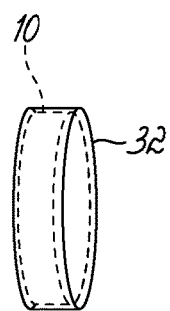
FIG. 2 is a perspective view of a copper disc coated with a graphene ink in accordance with an embodiment of the present invention.

It should be recognized that other forms of depositing graphene on the copper may be used. For example, with reference to FIG. 2, in an embodiment, the graphene ink method may be used to deposit graphene sheets onto the surfaces of copper profiles at room temperature. In this method, single atomic layer or multiple atomic layer thick graphene sheets are mixed with stabilizing agents (also called surfactants), solvents, or suspension fluids to form a graphene ink 32, which is coated onto the copper discs 10. The stabilizing agent may include, without limitation, ethanol, isopropanol, acetone, hexanes, water, or dimethylformamide. The copper discs 10 are then dried in convective air, which facilitates the evaporation of the stabilizing agent leaving behind graphene coated copper discs 10. The convective environment may consist of other gases than ambient air. For example, in an embodiment, the graphene ink can be dried in an environment that can be made of, without limitation, vacuum, argon, nitrogen, hydrogen, or a combination of gases. The copper disc 10 may be placed in a fume hood at room temperature to accelerate the evaporation of the stabilizing agents. The resulting graphene-coated copper profile may have a graphene layer of minimum thickness of 120 μm and with no restriction on the maximum thickness.

The weight percentage of the graphene in the copper-graphene composite may vary. At a minimum, the amount of graphene must be sufficient to improve the electrical properties of the metal. For example, the weight percentage of the graphene may range from greater than 0 and up to and including 50%. In an embodiment, the copper-graphene composite may include 0.00000001% to 50% by weight of graphene, 0.05% to 30% by weight of graphene, 0.01% to 5% by weight of graphene, with a preferred range of from greater than zero up to and including 1%. The balance of the copper-graphene composite is primarily copper but may include trace amounts of other elements (such as impurity elements already present in the copper profile). The copper may include, without limitation, UNS 10100, UNS11000, UNS 12200, or ultra-pure copper as well as other copper alloys. Examples of the bulk forms of the copper-graphene composite, with embedded graphene include, without limitation, a wire, a rod, a tube, a strand, a strip, a foil, a plate, or a bar.

The resulting ultra-conductive metal-graphene composite form (e.g., the wire 30) may have a similar or increased electrical conductivity compared to the IACS standard and may have an increased ampacity. For example, an ultra-conductive copper wire or other bulk form according to the present invention may have an electrical conductivity of from about 57.6 MS/m (99.3% IACS) to about 60.90 MS/m (105% IACS) or greater, and an ampacity of about 19.1 $MA/m^2$ at a temperature of 60° C., or greater. The ultra-conductive copper bulk form may have a higher ampacity compared to the IACS standard at temperatures of from 20° C. to 150° C. The corresponding values for commercially available copper wire procured from CerroWire LLC are 57.82 MS/m (99.69% IACS) and 3 to 4 $MA/m^2$ at a temperature of 20° C. and 15.9 $MA/m^2$ at 60° C. The corresponding values for commercially available copper wire procured from SouthWire LLC are 56.91 MS/m (98.11% IACS) and 3 to 4 $MA/m^2$ at a temperature of 20° C. and 15.9 $MA/m^2$ at 60° C. For another example, an ultra-conductive aluminum wire or other bulk form according to the present invention may have an electrical conductivity of greater than 34.5 MS/m (59.58% IACS), or about 34.76 MS/m (59.93% IACS). The corresponding values for an aluminum wire made from commercially available AA1100 was 34.5 MS/m (59.58% IACS).

In order to facilitate a more complete understanding of the embodiments of the invention, the following non-limiting examples are provided.

Example 1

A copper rod that was 0.625 inch in diameter and made of 4N purity (or typical UNS 10100 copper) was cut into discs with circular cross section and approximately 0.125 in thickness. Next, the copper discs were placed in a bath of acetic acid for 1 minute to clean the surface of the copper discs.

Next, a graphene layer was deposited directly onto the face of the copper discs via chemical vapor deposition (CVD). The copper discs were placed flat on the sides of a quartz holder and introduced into the CVD chamber. A vacuum of less than 50 milliTorrs (mTorr) was achieved in the CVD chamber. The quartz chamber was then flooded with hydrogen gas for another 15 minutes at 100 $cm^3$/min to purge any remaining oxygen, while periodically checking for hydrogen leaks. The furnace was heated to a range of about 900° C. to 1100° C. for 16 to 25 minutes. During this heating, the quartz holder with copper discs was positioned in the center of the CVD chamber for heating. Once the final temperature was reached in the furnace, it was maintained for an additional 15 to 30 minutes to ensure the copper discs reached equilibrium temperature with the furnace environment. A graphene precursor gas, comprising of processed methane along with carrier gases (e.g., hydrogen, methane, carbon monoxide, noble gases) was then introduced into the CVD chamber at a rate of at 0.1 liters per minute (l/min) for 5 to 10 minutes during which graphene was deposited onto the copper disc surfaces. Oxides and impurities were removed from the copper disc surfaces in the CVD chamber prior to graphene deposition facilitated by the high temperature and reducing atmosphere in the CVD chamber. Additionally, the deposition of graphene sealed the surfaces of the copper disc, thereby minimizing any further oxidation prior to subsequent processing. The copper discs were then reclaimed, stacked, and wrapped in copper foil to assemble a billet of approximately 1 to 2 in in length.

The billet was placed in an experimental extrusion apparatus at 700° C. to 800° C. and hot-pressed for about 30 minutes with a force of 10,000 lb (providing a pressure of about 29,000 psi) prior to extrusion. It should be recognized that the force can be increased for larger billet sizes. A continuous flow of nitrogen gas was maintained to the apparatus during this step to minimize oxidation of the billet. The billet was then extruded at that temperature into a nitrogen gas environment to form the consolidated copper-graphene composite wire. The billet was formed into a wire of approximately 0.0808 in diameter (12 AWG wire) and approximately 24 in length (limited by the length of the billet).

The electrical conductivity and ampacity of the hot-extruded 12 AWG copper-graphene composite wire was measured according to ASTM standards and was reported to be 60.73 MS/m (104.7% IACS) at 20° C. and 19.1 $MA/m^2$ at 60° C., respectively. The corresponding values for commercially available copper wire procured from CerroWire LLC are 57.82 MS/m (99.69% IACS) and 3 to 4 $MA/m^2$ at a temperature of 20° C. and 15.9 $MA/m^2$ at 60° C. The corresponding values for commercially available copper wire procured from SouthWire LLC are 56.91 MS/m (98.11% IACS) and 3 to 4 $MA/m^2$ at a temperature of 20° C. and 15.9 $MA/m^2$ at 60° C.

Example 2

Copper discs were prepared according to the method described in Example 1. Next, graphene ink was coated on the transverse circular surfaces of the discs. The copper-graphene composite included 0.5% by weight of graphene. To create the graphene ink, 2 mL of isopropanol was mixed with the graphene sheets to achieve a mixture. The copper discs were coated with the graphene-isopropanol ink and placed in a fume hood at room temperature to evaporate the isopropanol. The coated discs were then reclaimed, stacked, and wrapped in a copper foil to assemble a billet with a length of approximately 1 to 2 in. The billet was extruded into a wire according to the method described in Example 1.

The electrical conductivity and ampacity of the hot-extruded 12 AWG copper-graphene composite wire was measured according to ASTM standards, and is reported to be 57.6 MS/m (99.3% IACS) and 19.1 MA/m$^2$ at 60° C., respectively. The corresponding values for commercially available copper wire procured from CerroWire LLC are 57.82 MS/m (99.69% IACS) and 3 to 4 MA/m$^2$ at a temperature of 20° C. and 15.9 MA/m$^2$ at 60° C. The corresponding values for commercially available copper wire procured from SouthWire LLC are 56.91 MS/m (98.11% IACS) and 3 to 4 MA/m$^2$ at a temperature of 20° C. and 15.9 MA/m$^2$ at 60° C.

While specific embodiments have been described in considerable detail to illustrate the present invention, the description is not intended to restrict or in any way limit the scope of the appended claims to such detail. The various features discussed herein may be used alone or in any combination. Additional advantages and modifications will readily appear to those skilled in the art. The invention in its broader aspects is therefore not limited to the specific details, representative apparatus and methods and illustrative examples shown and described. Accordingly, departures may be made from such details without departing from the scope of the general inventive concept.

Example 3

Discs of 0.625 in diameter were punched from an aluminum alloy sheet made of AA1100. Next, graphene ink was coated on the transverse circular surfaces of the discs. The aluminum-graphene composite included 0.25% by weight of graphene. To create the graphene ink, 2 mL of isopropanol was mixed with the graphene sheets to achieve a mixture. The aluminum discs were coated with the graphene-isopropanol ink and placed in a fume hood at room temperature to evaporate the isopropanol. The coated discs were then reclaimed, stacked, and wrapped in a pure aluminum foil to assemble a billet with a length of approximately 1 to 2 in. The billet was placed in an experimental extrusion apparatus at 350° C. to 550° C. and hot-pressed for about 30 minutes with a force of 3,000 lb (providing a pressure of about 8,500 psi) prior to extrusion. It should be recognized that the force can be increased for larger billet sizes. A continuous flow of nitrogen gas was maintained to the apparatus during this step to minimize oxidation of the billet. The billet was then extruded at that temperature into a nitrogen gas environment to form the consolidated aluminum-graphene composite wire. The billet was formed into a wire of approximately 0.0808 in diameter (12 AWG wire) and approximately 24 in length (limited by the length of the billet).

The electrical conductivity and ampacity of the hot-extruded 12 AWG aluminum-graphene composite wire was measured according to ASTM standards and was reported to be 34.76 MS/m (59.93% IACS). Control wires made of AA1100 without graphene measured to have an electrical conductivity of 34.5 MS/m (59.58% IACS).

While specific embodiments have been described in considerable detail to illustrate the present invention, the description is not intended to restrict or in any way limit the scope of the appended claims to such detail. The various features discussed herein may be used alone or in any combination. Additional advantages and modifications will readily appear to those skilled in the art. The invention in its broader aspects is therefore not limited to the specific details, representative apparatus and methods and illustrative examples shown and described. Accordingly, departures may be made from such details without departing from the scope of the general inventive concept.

What is claimed is:

1. A method of forming a metal-graphene composite comprising:
    coating metal components with graphene to form graphene-coated metal components;
    stacking a plurality of the graphene-coated metal components to form a precursor workpiece, wherein the graphene of the plurality of graphene metal-coated metal components is primarily oriented perpendicular to an axis that is parallel to the stacking direction of the precursor workpiece; and
    working the precursor workpiece into a bulk form to form the metal-graphene composite, wherein the working of the precursor workpiece comprises reducing a dimension of the precursor workpiece in a direction substantially perpendicular to the stacking direction of the precursor workpiece.

2. The method of claim 1, wherein coating comprises depositing the graphene on the metal component using chemical vapor deposition.

3. The method of claim 1, wherein coating comprises coating the metal component with a graphene ink or suspension.

4. The method of claim 1, wherein combining the plurality of graphene-coated metal components includes:
    assembling the graphene-coated metal components; and
    covering the assembled metal components in a metal foil to form the precursor workpiece.

5. The method of claim 1, wherein the precursor workpiece is in the form of a billet, rod, plate, or sheet.

6. The method of claim 1, wherein working the precursor workpiece into the bulk form includes extruding, rolling, or drawing the precursor workpiece to form the bulk form.

7. The method of claim 6, wherein working the precursor workpiece into the bulk form is performed by extruding, and wherein the extruding includes a step of cold pressing or hot pressing the precursor workpiece under force.

8. The method of claim 7, wherein hot pressing includes applying pressures up to 50 kpsi to the precursor workpiece at temperatures up to 900° C., and cold pressing includes applying pressures up to 75 kpsi to the precursor workpiece at ambient temperature.

9. The method of claim 1, wherein the bulk form is one of a wire, a rod, a tube, a strand, a bar, a plate, a sheet, a strip, or a foil.

10. The method of any of the preceding claims, wherein the metal components are selected from the group consisting of: copper components, aluminum components, silver components, gold components, titanium components, nickel components, iron components, magnesium components, manganese components, cobalt components, zinc components, and chromium components.

11. The method of claim 10, wherein the metal components are copper components.

12. The method of claim 11, wherein an electrical conductivity of the metal-graphene composite is greater than 58.001 MS/m.

* * * * *